United States Patent [19]
Boerstler et al.

[11] Patent Number: 5,757,240
[45] Date of Patent: May 26, 1998

[54] LOW GAIN VOLTAGE-CONTROLLED OSCILLATOR

[75] Inventors: David William Boerstler, Round Rock; Daniel Mark Dreps, Georgetown, both of Tex.

[73] Assignee: International Business Machines Corporation, Armonk, N.Y.

[21] Appl. No.: 673,542

[22] Filed: Jul. 1, 1996

[51] Int. Cl.[6] .............................. H03L 7/06; H03L 7/185
[52] U.S. Cl. .................... 331/34; 331/57; 331/177 R; 331/179; 331/DIG. 2
[58] Field of Search ............................. 331/34, DIG. 2, 331/57, 173, 177 R, 179

[56] References Cited

U.S. PATENT DOCUMENTS

| | | | |
|---|---|---|---|
| 5,075,640 | 12/1991 | Miyazawa | 331/10 |
| 5,260,979 | 11/1993 | Parker et al. | 375/108 |
| 5,304,955 | 4/1994 | Atriss et al. | 331/1 R |
| 5,475,344 | 12/1995 | Naneatis et al. | 331/57 |

OTHER PUBLICATIONS

Alvarez, Jose, et al., A Wide–Bandwidth Low–Voltage PLL for PowerPC™ Microprocessors, *IEEE Journal of Solid–State Circuits*, vol. 30, No. 4, Apr. 1995, pp. 383–391.
Enam, S. Khursheed, et al., "NMOS IC's for Clock and Data Regeneration in Gigabit–per–Second Optical–Fiber Receivers," *IEEE Journal of Solid–State Circuits*, vol. 27, No. 12, Dec. 1992, pp. 1763–1774.

Novof, Ilya, et al., "Fully–Integrated CMOS Phase–Locked Loop with 15 tro 240 MHz Locking Range and ±50 ps Jitter," *1995 IEEE International Solid State Circuits Conference—Digest of Technical Papers*, Feb. 16, 1995, pp. 112–113.
Young, Ian A., et al., A PLL Clock Generator with 5 to 110 MHz of Lock Range for Microprocessors, *IEEE Journal of Solid–State Circuits*, vol 27, No. 11, Nov. 1992, pp. 1599–1607.

*Primary Examiner*—Timothy P. Callahan
*Assistant Examiner*—An T. Luu
*Attorney, Agent, or Firm*—Winstead Sechrest & Minick PC; Anthony V. S. England

[57] ABSTRACT

A voltage controlled-oscillator ring oscillator having an adjustable high-frequency reference and an adjustable low-frequency reference. A mixer and a plurality of delay elements comprise a delay interpolating oscillator ring. The mixer receives a high-frequency reference input signal from a first multiplexer which selects the output of one of several delay elements having relatively short delay loop paths. The mixer receives a low-frequency reference input signal from a second multiplexer which selects the output of one of several delay elements having relatively long delay loop paths. The frequency of the mixer output is continually adjustable between the high-frequency reference and the low-frequency reference. As operating conditions change the first and second multiplexers can select the outputs of different delay elements in order to change the frequency of the high-frequency and low-frequency references.

20 Claims, 3 Drawing Sheets

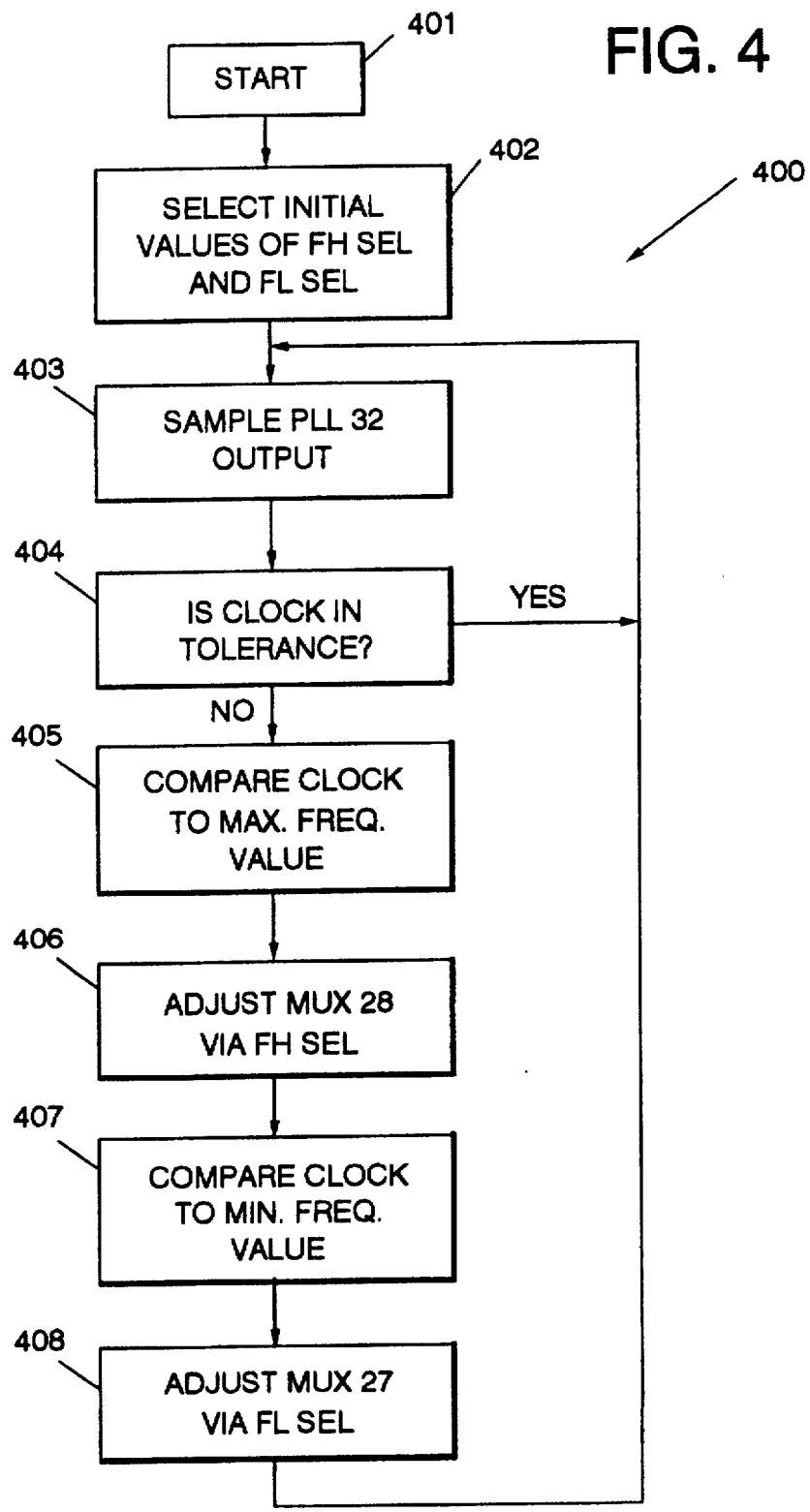

LOW GAIN VOLTAGE-CONTROLLED OSCILLATOR

TECHNICAL FIELD

The present invention relates in general to electronic circuits and systems and, in particular, to phase-locked loops containing voltage-controlled oscillators and circuits and systems incorporating such devices.

BACKGROUND INFORMATION

Phase-locked loop (PLL) circuits containing voltage-controlled oscillators (VCOs) are widely known in the art. An analog PLL for de-skewing the internal logic control clock of a microprocessor is described in *A PLL Clock Generator With 5 to 110 MHz of Lock Range for Microprocessors*, Young et al., IEEE Journal of Solid State Circuits, Vol. 27, No. 11, pp. 1599–1607 (hereafter, the "Young et al. reference"). A 3.3 volt PLL clock synthesizer is described in *A Wide-Bandwidth Low-Voltage PLL for PowerPC™ Microprocessors*, Alvarez et al., IEEE Journal of Solid State Circuits, Vol. 30, No. 4, pp. 383–391 (hereafter, the "Alvarez et al. reference"). A PLL for extracting a clock from a pseudo-random sequence is described in *NMOS IC's for Clock and Data Regeneration in Gigabit-per Second Optical-Fiber Receivers*, Enam et al., IEEE Journal of Solid State Circuits, Vol. 27, No. 12, pp. 1763–1992 (hereafter, the "Enam et al. reference"). Finally, a CMOS PLL design having minimum jitter over a large operating range is disclosed in *Fully-Integrated CMOS Phase-Locked Loop with 15 to 240 Mhz Locking Range and +/−50 ps Jitter*, Novof et al., Paper TA 6.5, 1995 IEEE International Solid-State Circuits Conference. The teachings disclosed in these references are hereby incorporated by reference in the present disclosure as if fully set forth herein.

Voltage-controlled oscillators (VCOs) used in high-frequency microprocessor phase-locked loops (PLLs) typically have high gain. Switching activity in a microprocessor can vary greatly, depending on the software program being executed. The microprocessor can have intervals in which there is heavy circuit activity that switches a large amount of capacitance within the chip. In other time intervals there is very little circuit activity. This type of variation in processor activity can shift the power supply voltage levels to produce a low-frequency step function on the power supply rails. Furthermore, switching of high-capacitance nodes in the microprocessor during individual cycles produces high-frequency noise at or above the clock frequency. Both the high-frequency and the low-frequency noise may be coupled to the VCO in the PLL through the power supply, parasitic paths, and the substrate. The noise may thus be amplified by the VCO, resulting in excess jitter in the clock signals generated by the PLL.

In processes where component parameters may be tightly controlled, VCOs may be designed with low gain in order to minimize the noise amplification and reduce clock jitter. Low-gain VCOs are designed so that the operating range of the VCO covers only the minimum range of frequencies required for proper system operation, plus some design margin. However, for a fully-integrated CMOS design, wide variations in device characteristics due to temperature, power supply, and process technology substantially increase the operating frequency range of VCOs. Thus, conventional CMOS VCOs must be designed to operate over an expanded range to overcome this variability. This necessitates that the VCO have a significantly higher gain and results in significantly higher sensitivity to noise and higher jitter. As CMOS technology progresses towards ever higher frequencies, higher power (i.e., noise), and lower supply voltage levels, the gain issue becomes increasingly more important. The Young et al. reference describes these power supply noise problems for microprocessor PLLs in greater detail.

The Alvarez et al. and Novof et al. references describe relatively low-speed (<200 MHz) PLL designs for microprocessors in 3.3 volt CMOS technologies. Mapping these designs to lower voltage technologies results in very high VCO gains, primarily due to the sensitivity of the current-starved control mechanisms which both designs incorporate (a pervasive technique).

There is therefore a need for voltage-controlled oscillators that have low-gain in order to reject noise and minimize output frequency jitter and that can operate over a wide range of variations in component parameters and operating conditions.

There is a still further need for phase-locked loops that can be externally controlled to adjust the output frequency of the PLL's voltage-controlled oscillator to compensate for process and environmental effects.

SUMMARY OF THE INVENTION

The principles of the present invention are embodied in a circuit for producing an oscillating reference signal, the circuit comprising a plurality of delay elements coupled in series from an initial delay element to an Nth delay element, a mixer having a first input for receiving a first selected output signal from a first selected delay element, a second input for receiving a second selected output signal from a second selected delay element, and an output coupled to the input of the initial delay element for generating the oscillating reference signal. The circuit further comprises a first switch having an output coupled to the first mixer input and a plurality of inputs coupled to outputs of at least two selected ones of the plurality of delay elements, the first switch operable to select the first selected output signal and transmit the first selected output signal to the first mixer input in response to a first selection signal, and a second switch having an output coupled to the second mixer input and a plurality of inputs coupled to outputs of at least two selected ones of the plurality of delay elements, the second switch operable to select the second selected output signal and transmit the second selected output signal to the second mixer input in response to a second selection signal.

In another embodiment of the present invention, an integrated circuit is provided comprising processing circuitry for receiving an oscillating reference signal and a phase locked-loop circuit coupled to the processing circuitry for generating the oscillating reference signal. The phase-locked loop circuitry comprises a voltage-controlled oscillator for producing an oscillating reference signal, the voltage-controlled oscillator comprising a plurality of delay elements coupled in series from an initial delay element to an Nth delay element and a mixer having a first input for receiving a first selected output signal from a first selected delay element, a second input for receiving a second selected output signal from a second selected delay element, and an output coupled to the input of the initial delay element for generating the oscillating reference signal. The voltage-controlled oscillator further comprises a first switch having an output coupled to the first mixer input and a plurality of inputs coupled to outputs of at least two selected ones of the plurality of delay elements, wherein the first switch is operable to select the first selected output signal and transmit the first selected output signal to the first mixer input in response to a first selection signal. The voltage-controlled oscillator further comprises a second switch having an output coupled to the second mixer input and a plurality of inputs coupled to outputs of at least two selected ones of the plurality of delay elements. wherein the second switch is operable to select the second selected output signal and transmit the second selected output signal to the second mixer input in response to a second selection signal.

In still another embodiment of the present invention. an adaptive circuit is provided for adjusting the frequency of an oscillating reference signal. The adaptive circuit comprises a phase-locked loop circuit for receiving an external reference signal and generating therefrom the oscillating reference signal. the phase locked loop comprising a voltage-controlled oscillator (VCO) having an output signal adjustable in frequency between a high-frequency reference signal generated by the VCO and a low-frequency reference signal generated by the VCO. wherein the VCO output is adjusted by a control signal generated by the phase-locked loop. The adaptive circuit further comprises a lock indicator circuit coupled to the phase-locked loop circuit for determining if the oscillating reference signal is within a selected operating range. the selected operating range having a maximum frequency limit and a minimum frequency limit. and producing an error signal when the oscillating reference signal is outside the selected operating range, and a processor coupled to the lock indicator circuitry for receiving the error signal and. in response to the error signal, adjusting the high-frequency reference signal and the low-frequency reference signal generated by the VCO.

The foregoing has outlined rather broadly the features and technical advantages of the present invention in order that the detailed description of the invention that follows may be better understood. Additional features and advantages of the voltage-controlled oscillator (VCO) will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings. in which:

FIG. 4 is a flow diagram of the operation of a control circuit for adaptively controlling a phase-locked loop incorporating a delay interpolating voltage-controlled ring oscillator in accordance with the present invention.

DETAILED DESCRIPTION

Figure 1:
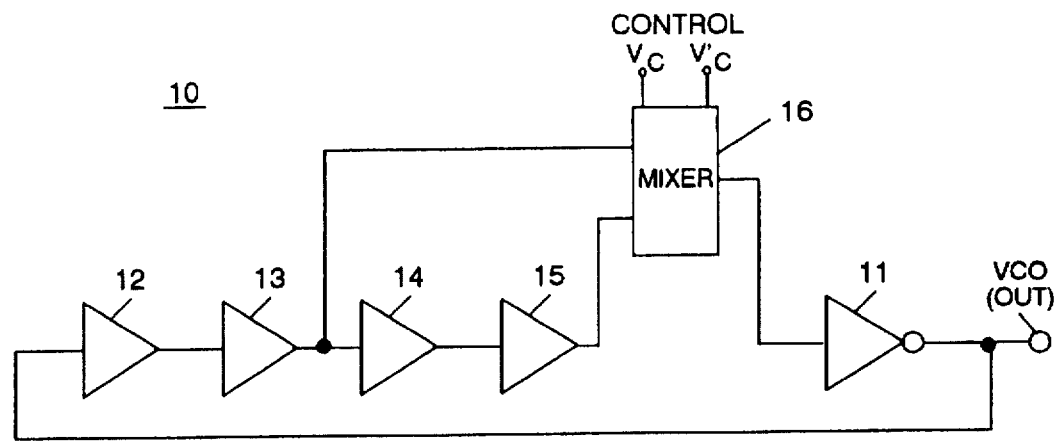
FIG. 1 is a block diagram of a delay interpolating voltage-controlled ring oscillator in accordance with the prior art.

FIG. 1 illustrates a block diagram of a prior art delay interpolating voltage-controlled oscillator ring 10 as described in the Enam et al. reference. Voltage-controlled oscillator (VCO) ring 10 is comprised of delay elements 11–15 and mixer 16. The outputs of the delay elements 13 and 15 are tapped and input to mixer 16. The output of delay element 11 is tapped to provide output signal VCO (OUT). An odd number of inversions is required in the loop in order for oscillation to occur. In the example shown. only delay element 11 is an inverting delay element. Since delay element 11 is always in the loop. an odd number of versions is always present and oscillation will occur. In other types of delay interpolating VCO rings. more than one delay element. and perhaps all delay elements. may be inverting. provided the total number of inversions in the loop remains odd.

The output of mixer 16 is controlled by signal CONTROL. which comprises two input voltages. $V_c$ and $V'_c$. In some embodiments. the input stage of mixer 16 is a differential pair which receives $V_c$ and $V'_c$ and produces an output proportional to the voltage difference between $V_c$ and $V'_c$. The output signal of mixer 16 thus varies in phase between a maximum value determined by the maximum number of gate delays in the loop and a minimum value determined by the minimum number of gate delays in the loop. For example. when $V_c$ is fully ON and $V'_c$ is fully OFF. the loop delay is determined by the delays of delay elements 11–13 and mixer 16. When $V_c$ is fully OFF and $V'_c$ is fully ON. the loop delay is determined by the delays of delay elements 11–15 and mixer 16. Since the period of a ring oscillator is approximately equal to the sum of all the rise time delays ($t_R$) and fall time delays ($t_F$) in the ring. the maximum and minimum periods for VCO ring 10 are $6(t_R+t_F)$ and $4(t_R+t_F)$ (assuming approximately equal rise times and fall times for all delay elements. including mixer 16). Since mixer 16 is a proportional device. the period of delay-interpolating VCO ring 10 is continuously adjustable between T(max) and T(min) by varying the signal CONTROL. Depending on system requirements. different numbers of delay elements may be used and the taps that are input to mixer 16 may be further apart. thereby providing different ranges of frequency from a minimum frequency= 1/T(max.) to a maximum frequency=1/T(min).

Although the frequency range is tightly constrained with a delay-interpolating VCO. potentially wide variations in center frequency due to operating conditions (e.g.. temperature, supply voltage) and process can move the narrow operating range well outside the system specifications for the microprocessor or other device in which delay-interpolating VCO ring 10 is fabricated.

Figure 2:
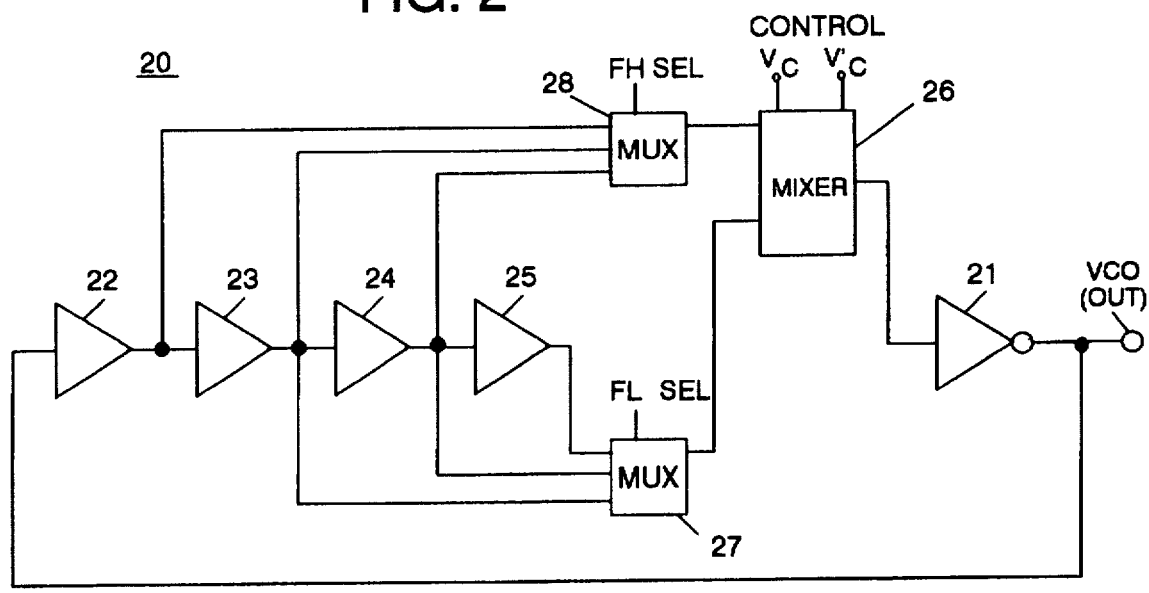
FIG. 2 is a block diagram of a delay interpolating voltage-controlled ring oscillator in accordance with an embodiment of the present invention.

FIG. 2 is a block diagram of a delay interpolating voltage-controlled oscillator (VCO) ring in accordance with one embodiment of the present invention. Delay interpolating VCO ring 20 contains delay elements 21–25 and mixer 26. The output of delay element 21 is tapped to provide output signal VCO (OUT). VCO ring 20 further includes transfer-gate multiplexers 27 and 28 (labeled "MUX"). VCO ring 20 uses multiplexers 27 and 28 to switch multiple taps from the outputs of delay elements 22–25 into the two inputs of mixer 26. This allows compensation adjustments to be made to the high-frequency limit and low-frequency limit of VCO ring 20. so that the process and operating condition factors may be minimized or eliminated.

The signal FH SEL selects a high frequency limit by selecting a minimum value of loop delay from the outputs of delay elements 22, 23, or 24 and inputting the tapped delay to mixer 26. The signal FL SEL selects a low frequency limit by selecting a maximum value of loop delay from the outputs of delay elements 23. 24. or 25 and inputting the tapped delay to mixer 26. The signal CONTROL varies the output of mixer 26, similarly as described above in FIG. 1, between the high frequency limit and the low frequency limit. The example shown in FIG. 2 may be operated over a range of low frequency limits from approximately T=4 $(t_R+t_F)$ to $6(t_R+t_F)$ and over a range of high frequency limits from approximately T=$3(t_R+t_F)$ to $5(t_R+t_F)$ by selecting the appropriate taps via FH SEL and FL SEL.

The gain of VCO ring 20 changes as the number of delay elements bypassed varies. For the example shown in FIG. 2, the ratio of the high frequency limit to low frequency limit, FH:FL, may be 6:5, 6:4, 6:3, 5:4, 5:3 or 4:3, depending on the taps selected. This represents a significant range adjustment capability. Since the gain of VCO ring 20 is proportional to the range of FH:FL, considerable gain adjustment capability is achieved.

The optimum settings of FH SEL and FL SEL will be values for which the VCO gain is minimized while covering all of the required operating frequency range. In other words, the amount of change in phase in the output of mixer 26 will be a minimum as the signal CONTROL is varied between a minimum value of frequency at which $V_c$ is fully OFF and $V'_c$ is fully ON to a maximum value of frequency at which $V_c$ is fully ON and $V'_c$ is fully OFF. The low gain allows finer adjustments to be made in the output phase of mixer 26 and reduces the sensitivity of VCO ring 20 to noise. The number of delay elements, mixers, and taps as well as the tap spacing is determined by the technology and performance requirements. The implementation of the delay elements is also flexible (e.g., differential amplifiers or inverters for the delay elements).

The FH SEL and FL SEL values may be set in several ways. The settings could be accomplished through a fuse (or similar device), a register, or a hard-wired technique once the process/environment correction is known. The correction might be based on indirect techniques (e.g., kerf data, replica monitors) or direct measurement. Finally, the output of mixer 26 could be adjusted by means of an external feedback loop at system initialization or continuously during operation.

Figure 3:
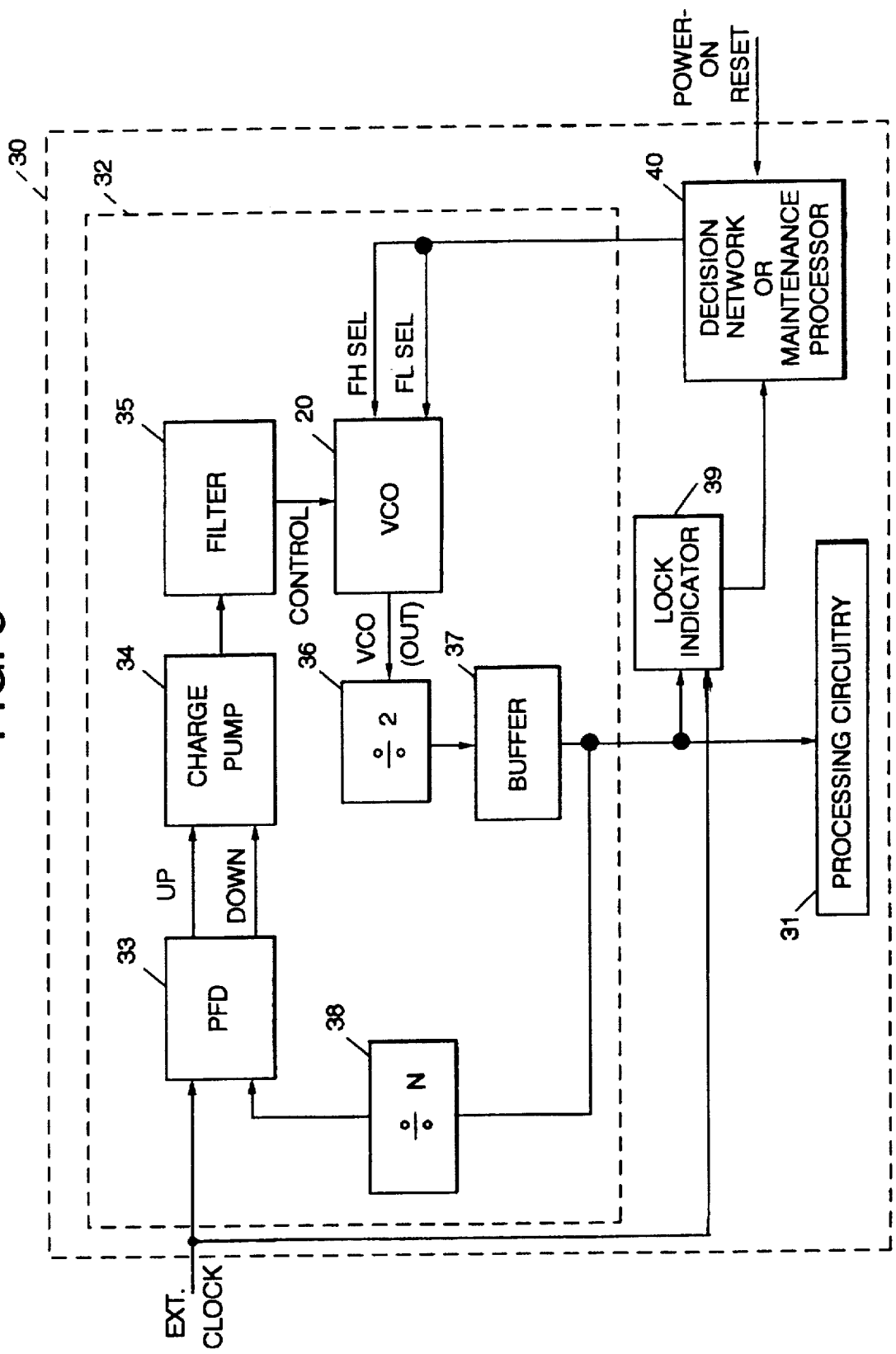
FIG. 3 is a block diagram of a processing circuit containing a control circuit for adaptively controlling a phase-locked loop that incorporates a delay interpolating voltage-controlled ring oscillator in accordance with the present invention.

FIG. 3 illustrates a block diagram of a microprocessor 30 containing control circuitry for adaptively adjusting the output of phase-locked loop (PLL) 32, which contains voltage-controlled oscillator ring 20 in accordance with the present invention. PLL 32 provides the clock signal used to drive processing circuity 31. Although PLL 32 and VCO ring 20 are implemented in a microprocessor in FIG. 3, it should be readily understood that in other embodiments of the present invention, VCO ring 20 and PLL 32 may be implemented in a wide variety of systems and integrated circuits requiring a stable clock reference signal, such as the signal produced by PLL 32.

Phase-locked loop 32 contains phase-frequency detector (PFD) 33, which detects the difference between the frequency of an external reference signal, EXT. CLOCK, and 1/N of the frequency of the internal microprocessor clock used to drive processing circuitry 31. If an error between the two clock signals is detected, PFD 33 sends UP or DOWN signals to charge pump 34, which outputs a correction voltage. Noise is removed from the correction voltage, which is integrated by filter 35 to produce the signal CONTROL, which adjusts the output of mixer 26 in VCO ring 20. The output of VCO ring 20 is divided in half by frequency divider 36 in order to produce a square wave with an accurate 50% duty cycle. Buffer 37 increases the current drive capability of PLL 32. The output of buffer 37 is the microprocessor clock signal used to drive processing circuitry 31 and is fed back to the input of PFD 33 by frequency divider 38, which produces 1/N of the microprocessor clock signal.

In one embodiment, lock indicator 39 uses the signal EXT.CLOCK for comparison with the processor clock. Lock indicator 39 verifies that the output of PLL 32 (and mixer 26) is within the specified operating range of microprocessor 30. If, however, the frequency output of PLL 32 drifts outside the operating range of the microprocessor 30 for given values of FL SEL and FH SEL, lock indicator 39 detects the error condition and sends an error signal to decision network/maintenance processor 40 (hereafter "decision network 40"). Decision network 40 determines new values of FH SEL and FL SEL that are operable to bring the output of PLL 32 back within tolerance and adjusts FH SEL and FL SEL in order to switch multiplexers 27 and 28 accordingly. Thus, the control circuitry in FIG. 3 adjusts the signals FH SEL and FL SEL to keep the output of PLL 32 within tolerance across a wide range of operating conditions and component variations.

Flow diagram 400 in FIG. 4 depicts the operation of lock indicator 39 and decision network 40 in adaptively controlling PLL 32 in one embodiment of the present invention. Upon start-up (Step 401), the signals FL SEL and FH SEL are set to initial default values (Step 402) determined by system design. The output of PLL 32 is sampled by lock indicator 39 (Step 403) to determine if the clock signal produced by PLL 32 is within tolerance (Step 404). If the clock signal is within tolerance, lock indicator 39 continues to sample the clock signal output of PLL 32.

If, however, PLL 32 output is not within system tolerance, decision network 40 will adaptively adjust FH SEL and FL SEL to bring PLL 32 output within tolerance with a minimum frequency range from FL SEL to FH SEL in order to minimize the gain (Hz/V) of VCO ring 20. PLL 32 output is compared to the upper frequency limit of the system clock specification (Step 405) and the signal FH SEL switches MUX 28 (Step 406) to select a different tap in the oscillator ring that will being PLL 32 output back within tolerance. Similarly, PLL 32 output is compared to the lower frequency limit of the system clock specification (Step 407) and the signal FL SEL switches MUX 27 (Step 408) to select a different tap in the oscillator ring that will being PLL 32 output back within tolerance. In one embodiment, the minimum value of FH SEL and the maximum value of FL SEL are selected that constrain PLL 32 output within the proper operating range in order to minimize gain and noise sensitivity. For example, if microprocessor 30 has a clock speed of 100 MHz and FL SEL may be selected to be 85, 90 or 95 MHz and FH SEL may be selected to be 105, 110 or 115 MHz, then the minimum value of FH SEL needed to constrain PLL 32 output would be 105 MHz and the maximum value of FL SEL needed to constrain PLL 32 output would be 95 MHz. The signal CONTROL is then used to fine tune VCO (OUT) to 100 MHZ using the 95 MHz reference provided by FL SEL and the 105 MHz provided by FH SEL.

Although the present invention and its advantages have been described in detail, it should be understood that various changes, substitutions and alterations can be made herein without departing from the spirit and scope of the invention as defined by the appended claims.

What is claimed is:

1. A circuit for producing an oscillating reference signal comprising:

a plurality of delay elements coupled in series from an initial delay element to an Nth delay element;

a mixer having a first input for receiving a first selected output signal from a first selected delay element, a second input for receiving a second selected output signal from a second selected delay element, and an output coupled to the input of said initial delay element for generating said oscillating reference signal;

a first switch having an output coupled to said first mixer input and a plurality of inputs coupled to outputs of at least two selected ones of said plurality of delay elements, said first switch operable to select said first selected output signal and transmit said first selected output signal to said first mixer input in response to a first selection signal; and a second switch having an output coupled to said second mixer input and a plurality of inputs coupled to outputs of at least two selected ones of said plurality of delay elements, said second switch operable to select said second selected output signal and transmit said second selected output signal to said second mixer input in response to a second selection signal.

2. The circuit in claim 1 wherein said first switch and second switch are multiplexers.

3. The circuit in claim 1 wherein said first selected output signal determines a maximum frequency of said oscillating reference signal.

4. The circuit in claim 1 wherein said second selected output signal determines a minimum frequency of said oscillating reference signal.

5. The circuit in claim 1 wherein said first selected output signal determines a maximum frequency of said oscillating reference signal and said second selected output signal determines a minimum frequency of said oscillating reference signal and said mixer controls a frequency of said oscillating reference signal on said mixer output between said maximum frequency and said minimum frequency in response to a received control signal.

6. The circuit in claim 1 wherein a loop path passing through said initial delay element, said first selected delay element, said first switch and said mixer contains an odd number of signal inverting circuits.

7. The circuit in claim 1 wherein a loop path passing through said initial delay element, said second selected delay element, said second switch and said mixer contains an odd number of signal inverting circuits.

8. An integrated circuit comprising:

processing circuitry for receiving an oscillating reference signal; and a phase locked-loop circuit coupled to said processing circuitry for generating said oscillating reference signal, said phase-locked loop circuitry comprising:

a voltage-controlled oscillator for producing an oscillating reference signal comprising:

a plurality of delay elements coupled in series from an initial delay element to an Nth delay element;

a mixer having a first input for receiving a first selected output signal from a first selected delay element, a second input for receiving a second selected output signal from a second selected delay element, and an output coupled to the input of said initial delay element for generating said oscillating reference signal;

a first switch having an output coupled to said first mixer input and a plurality of inputs coupled to outputs of at least two selected ones of said plurality of delay elements, said first switch operable to select said first selected output signal and transmit said first selected output signal to said first mixer input in response to a first selection signal; and a second switch having an output coupled to said second mixer input and a plurality of inputs coupled to outputs of at least two selected ones of said plurality of delay elements, said second switch operable to select said second selected output signal and transmit said second selected output signal to said second mixer input in response to a second selection signal.

9. The integrated circuit in claim 8 wherein said first switch and second switch are multiplexers.

10. The integrated circuit in claim 8 wherein said first selected output signal determines a maximum frequency of said oscillating reference signal.

11. The integrated circuit in claim 10 wherein said second selected output signal determines a minimum frequency of said oscillating reference signal.

12. The integrated circuit in claim 8 wherein said first selected output signal determines a maximum frequency of said oscillating reference signal and said second selected output signal determines a minimum frequency of said oscillating reference signal and said mixer controls a frequency of said oscillating reference signal on said mixer output between said maximum frequency and said minimum frequency in response to a received control signal.

13. The integrated circuit in claim 8 wherein a loop path passing through said initial delay element, said first selected delay element, said first switch and said mixer contains an odd number of signal inverting circuits.

14. The integrated circuit in claim 13 wherein a loop path passing through said initial delay element, said second selected delay element, said second switch and said mixer contains an odd number of signal inverting circuits.

15. An adaptive circuit for adjusting the frequency of an oscillating reference signal comprising:

a phase-locked loop circuit for receiving an external reference signal and generating therefrom an oscillating reference signal, said phase lock-locked loop comprising a voltage-controlled oscillator (VCO) having an output signal adjustable in frequency between a high-frequency reference limit generated by said VCO and a low-frequency reference signal generated by said VCO, wherein said VCO output is adjusted by a control limit generated by said phase-locked loop; wherein the voltage-controlled oscillator (VCO) comprising:

a plurality of delay elements coupled in series from an initial delay element to an Nth delay element;

a mixer having a first input for receiving a first selected output signal from a first select delay element, a second input for receiving a second selected output signal from a second selected delay element, and an output coupled to the input of said initial delay element for generating said oscillating reference signal;

a first switch having an output coupled to said first mixer input and a plurality of inputs coupled to outputs of at least two selected ones of said plurality of delay elements, said first switch operable to select said first selected output signal and transmit said first selected output signal to said first mixer input in response to a first selection signal; and a second switch having an output coupled to said second mixer input and a plurality of inputs coupled to outputs of at least two selected ones of said plurality of delay elements, said second switch operable to select said second selected output signal and transmit said second selected output signal to said second mixer input in response to a second selection signal;

a lock indicator circuit coupled to said phase-locked loop circuit for determining if said oscillating reference signal is within a selected operating range, said selected operating range having a maximum frequency limit and a minimum frequency limit, and producing an error signal when said oscillating reference signal is outside said selected operating range; and circuitry coupled to said lock indicator circuitry for receiving said error signal and, in response to said error signal, adjusting a selected one of said high-frequency reference limit and said low-frequency reference limit generated by said VCO.

16. The adaptive circuit in claim 15 wherein said VCO is a delay interpolating ring oscillator comprising a plurality of delay elements forming an inverting feedback loop.

17. The adaptive circuit in claim 16 wherein said high-frequency reference limit is adjusted by modifying the number of delay elements in said inverting feedback loop.

18. The adaptive circuit in claim 15 wherein said low-frequency reference limit is adjusted by modifying the number of delay elements in said inverting feedback loop.

19. In a voltage-controlled oscillator comprising N delay elements coupled in series and a mixer, wherein a first input of the mixer is switchably coupled to a first selected reference signal on an output of a first selected delay element and a second input of the mixer is switchably coupled to a second selected reference signal on an output of a second selected delay element and the mixer produces an oscillating output signal having a controllable frequency between a frequency of the first selected reference signal and a frequency of the second selected reference signal, the method comprising the steps of:

determining if the controllable frequency is greater than a maximum frequency of a desired frequency range; and in response to a determination that the controllable frequency is greater than the maximum frequency, switching the first mixer input to a third selected reference signal on an output of a third selected delay element, the third selected reference signal having a frequency less than the frequency of the first selected reference signal.

20. The method set forth in claim 19 including the further steps of:

determining if the controllable frequency is less than a minimum frequency of a desired frequency range; and in response to a determination that the controllable frequency is less than the minimum frequency, switching the second mixer input to a fourth selected reference signal on an output of a fourth selected delay element, the fourth selected reference signal having a frequency greater than the frequency of the second selected reference signal.

* * * * *